(12) United States Patent
Yamada et al.

(10) Patent No.: US 9,312,421 B2
(45) Date of Patent: Apr. 12, 2016

(54) PHOTOELECTRIC CONVERSION ELEMENT AND PHOTOELECTRIC CONVERTER

(75) Inventors: Yasuhiro Yamada, Kanagawa (JP); Tsutomu Tanaka, Kanagawa (JP); Makoto Takatoku, Kanagawa (JP); Ryoichi Ito, Aichi (JP); Michiru Senda, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 493 days.

(21) Appl. No.: 13/474,061

(22) Filed: May 17, 2012

(65) Prior Publication Data

US 2012/0299070 A1 Nov. 29, 2012

(30) Foreign Application Priority Data

May 27, 2011 (JP) .................. 2011-119502
Aug. 15, 2011 (JP) .................. 2011-177460

(51) Int. Cl.
  *H01L 29/04* (2006.01)
  *H01L 29/10* (2006.01)
  *H01L 31/00* (2006.01)
  *H01L 31/105* (2006.01)
  *H01L 31/0216* (2014.01)
  *H01L 27/146* (2006.01)

(52) U.S. Cl.
  CPC ........ *H01L 31/105* (2013.01); *H01L 27/14663* (2013.01); *H01L 31/02164* (2013.01)

(58) Field of Classification Search
  USPC .................. 257/458, 656, E31.061, E31.087, 257/E31.088, E29.336, E33.046, E51.022; 438/34, 82, 99, 149, 490; 439/113, 41, 439/43, 47–50; 362/257, 296.01, 299, 308, 362/296.04, 311.02; 313/48–512; 250/370.14; 445/24; 345/207
  See application file for complete search history.

(56) References Cited

U.S. PATENT DOCUMENTS

2006/0030084 A1* 2/2006 Young ........................ 438/149
2008/0049005 A1* 2/2008 Okita et al. .................. 345/207
2011/0043471 A1* 2/2011 Senda et al. ................. 345/173

FOREIGN PATENT DOCUMENTS

JP 2008-277710 11/2008
JP 2011-014752 1/2011

* cited by examiner

*Primary Examiner* — Meiya Li
(74) *Attorney, Agent, or Firm* — Hazuki International, LLC

(57) ABSTRACT

Disclosed herein is a photoelectric conversion element including: a first semiconductor layer of a first conductivity type provided above a substrate; a second semiconductor layer of a second conductivity type provided in a higher layer than the first semiconductor layer; a third semiconductor layer of a third conductivity type provided between the first and second semiconductor layers and lower in electrical conductivity than the first and second semiconductor layers; and a light-shielding layer provided between the substrate and first semiconductor layer.

18 Claims, 19 Drawing Sheets

F I G . 6
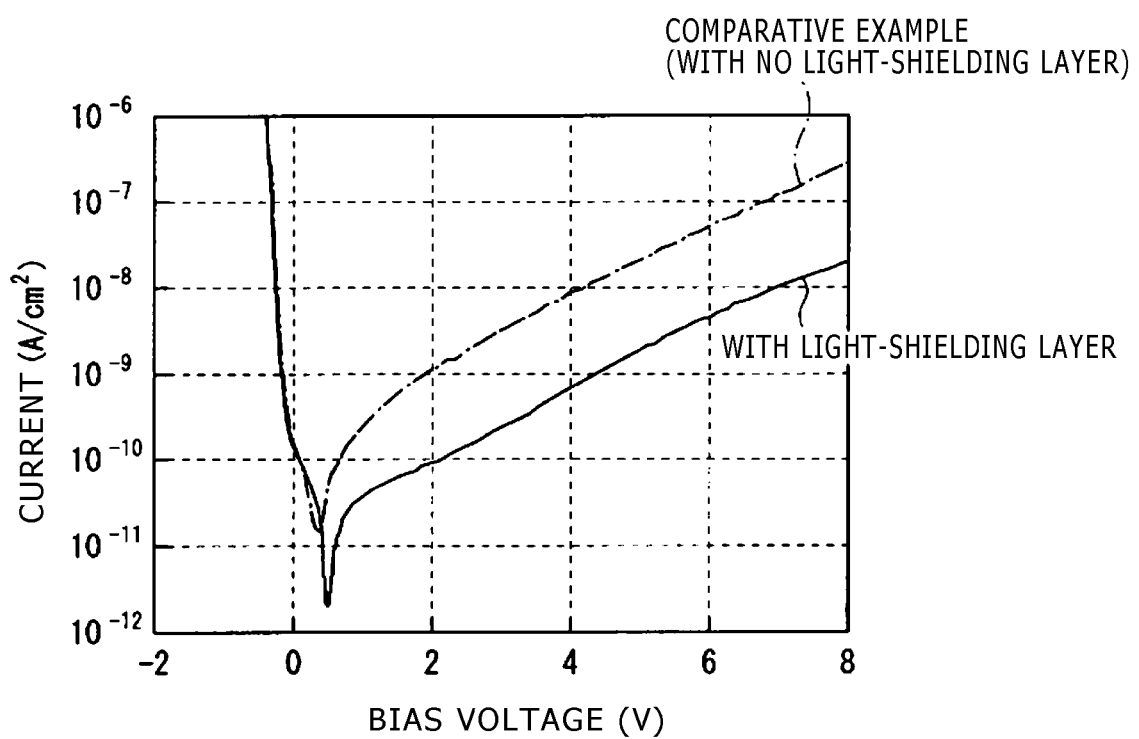

PHOTOELECTRIC CONVERSION ELEMENT AND PHOTOELECTRIC CONVERTER

CROSS-REFERENCE TO RELATED APPLICATIONS

This application claims priority to Japanese Patent Application No. JP 2011-177460, filed in the Japan Patent Office on Aug. 15, 2011, and Japanese Patent Application No. JP 2011-119502, filed in the Japan Patent Office on May 27, 2011, the entire disclosures of which are hereby in corporated herein by reference.

BACKGROUND

The present disclosure relates to a photoelectric conversion element suitable for use, for example, in radiographic imagers and touch sensors and a photoelectric converter using the same.

Recent years have seen the use of PIN (Positive Intrinsic Negative Diode) photodiodes in radiographic imagers and touch sensors as photoelectric conversion elements. These PIN photodiodes have a so-called i-type semiconductor layer sandwiched between p- and n-type semiconductor layers, thus allowing for extraction of a signal charge commensurate with the amount of incident light (e.g., Japanese Patent Laid-Open Nos. 2008-277710 and 2011-14752).

SUMMARY

However, if a p-, n- and i-type semiconductor layers are stacked vertically one on top of the other as in the PIN photodiode described, for example, in Japanese Patent Laid-Open No. 2011-14752, the photodiode may be susceptible to optical noise. Using such a photodiode, for example, in a radiographic imager results in degraded image quality.

The present disclosure has been made in light of the foregoing, and it is desirable to provide a photoelectric conversion element and a photoelectric converter that contribute to reduced susceptibility to optical noise.

A photoelectric conversion element according to an embodiment of the present disclosure includes a first semiconductor layer of a first conductivity type, a second semiconductor layer of a second conductivity type, a third semiconductor layer of a third conductivity type and a light-shielding layer. The first semiconductor layer is provided above a substrate. The second semiconductor layer is provided in a higher layer than the first semiconductor layer. The third semiconductor layer is provided between the first and second semiconductor layers and lower in electrical conductivity than the first and second semiconductor layers. The light-shielding layer is provided between the substrate and first semiconductor layer.

A photoelectric converter according to the embodiment of the present disclosure includes a plurality of pixels each of which includes the photoelectric conversion element according to the embodiment of the present disclosure.

In the photoelectric conversion element and photoelectric converter according to the embodiment of the present disclosure, the first semiconductor layer of the first conductivity type is provided above the second semiconductor layer of the second conductivity type with the third semiconductor layer of the third conductivity type sandwiched therebetween. This allows for a signal charge to be extracted based on light entering from the side of the second semiconductor layer (allows for photoelectric conversion to take place). Of the light entering from the side of the second semiconductor layer, that which transmits through the third and first semiconductor layers and exits to the substrate side is blocked by the light-shielding layer provided between the substrate and first semiconductor layer. At the same time, light proceeding from the substrate side toward the first semiconductor layer is blocked.

In the photoelectric conversion element and photoelectric converter according to the embodiment of the present disclosure, the first semiconductor layer of the first conductivity type, the third semiconductor layer and the second semiconductor layer of the second conductivity type are provided in this order from the substrate side. In addition, the light-shielding layer is provided between the substrate and first semiconductor layer. This makes it possible to suppress undesired light (optical noise) from entering into or leaving from the photoelectric conversion element via the first semiconductor layer, thus contributing to reduced susceptibility to optical noise.

Further, this suppresses, for example, so-called crosstalk between adjacent pixels in the photoelectric converter according to the embodiment of the present disclosure. Therefore, the degradation of captured image quality such as reduction in resolution can be suppressed. In a touch sensor, on the other hand, erroneous detection can be suppressed.

BRIEF DESCRIPTION OF THE DRAWINGS

FIG. 6 is a characteristic diagram for describing the other effect achieved by the photodiode shown in FIG. 1;

DETAILED DESCRIPTION OF THE PREFERRED EMBODIMENT

A description will be given below of the preferred embodiment of the present disclosure with reference to the accompanying drawings. It should be noted that the description will be given in the following order.
1. Embodiment (example of a photodiode in which a light-shielding layer is provided in a lower layer than the lower semiconductor layer (p-type and polycrystalline silicon))
2. Modification example 1 (another example of arrangement of the light-shielding layer)
3. Application example (example of a photoelectric converter (radiographic imager or touch sensor) using the above photodiode)
4. Modification example 2 (example in which the light-shielding layer and a gate electrode are provided in different layers)
5. Modification example 3 (example in which a signal is extracted from the bottom (p-type semiconductor layer))
6. Modification example 4 (example in which a signal is extracted from the bottom (n-type semiconductor layer))

<Embodiment>
[Configuration]

Figure 1:
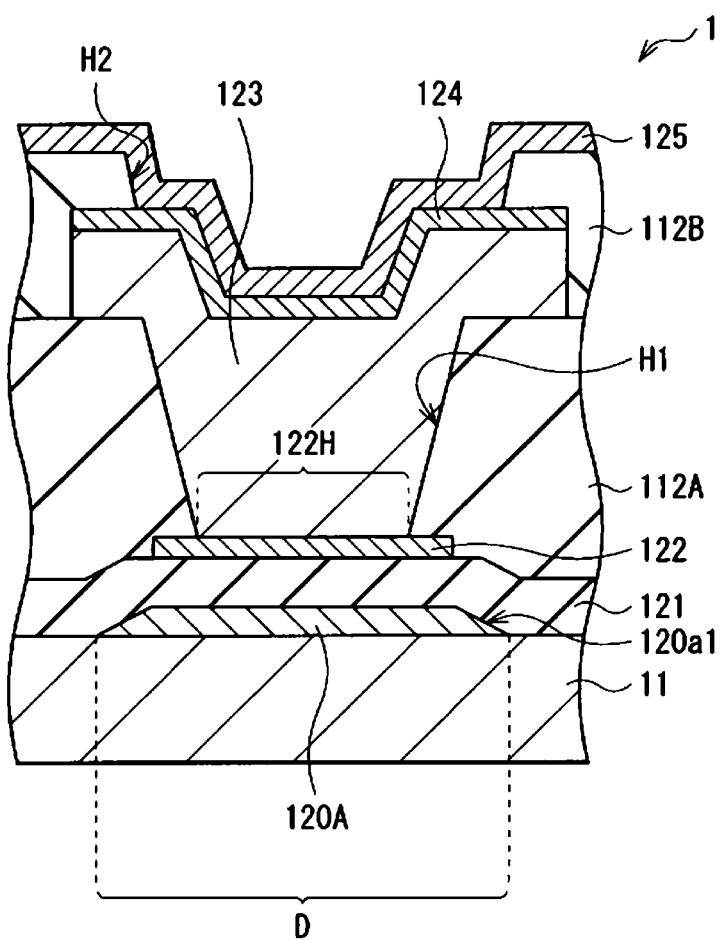
FIG. 1 is a cross-sectional view illustrating a rough configuration of a photodiode according to an embodiment of the present disclosure.

FIG. 1 illustrates a rough configuration of a photodiode (photodiode 1) according to an embodiment of the present disclosure. The photodiode 1 is a photoelectric conversion element adapted to generate a charge (optical charge) commensurate with the amount of incident light (received light) and store the generated charge therein. The photodiode 1 is a PIN (Positive Intrinsic Negative Diode) photodiode having an i-type semiconductor layer (intrinsic semiconductor layer) sandwiched between p- and n-type semiconductor layers.

The photodiode 1 has, for example, a p-type semiconductor layer 122, i-type semiconductor layer 123 and n-type semiconductor layer 124 stacked in this order from the side of a substrate 11 made of glass or other material. More specifically, in the photodiode 1, the p-type semiconductor layer 122 is provided in a selective region above the substrate 11 (more precisely, on an insulating film 121 which will be described later). A first interlayer insulating film 112A is provided that has a contact hole H1 opposed to the p-type semiconductor layer 122. The i-type semiconductor layer 123 is provided on the p-type semiconductor layer 122 in such a manner as to fill the contact hole H1 of the first interlayer insulating film 112A. The n-type semiconductor layer 124 is formed on this i-type semiconductor layer 123. A second interlayer insulating film 112B is provided on the n-type semiconductor layer 124 and first interlayer insulating film 112A. The second interlayer insulating film 112B has a contact hole H2 formed to be opposed to the n-type semiconductor layer 124. An upper electrode 125 is connected on the n-type semiconductor layer 124 via the contact hole H2.

It should be noted that although a configuration is shown here in which the p-type semiconductor layer 122 is provided on the substrate side (at the bottom), and the n-type semiconductor layer 124 at the top, a configuration opposite to the above, i.e., that in which the n-type semiconductor layer 124 is provided at the bottom (on the substrate side) and the p-type semiconductor layer 122 at the top, may be used. On the other hand, the p-type semiconductor layer 122 corresponds to a specific example of a "first semiconductor layer," the n-type semiconductor layer 124 to a specific example of a "second semiconductor layer," and the i-type semiconductor layer 123 to a specific example of a "third semiconductor layer" in the embodiment of the present disclosure.

The insulating film 121 is a single-layer film that includes, for example, one of silicon oxide ($SiO_2$), silicon oxynitride ($SiON_x$) and silicon nitride ($SiN_x$) films or a laminated film that includes two or more of the above films. It should be noted that if the photodiode 1 is used, for example, in each of the pixels of the photoelectric converter, the insulating film 121 may be formed as the same layer 121 as the gate insulating film of the transistor provided in the same pixel (the insulating film 121 may serve also as a gate insulating film).

The p-type semiconductor layer 122 is made of a semiconductor material low in electric resistivity such as polycrystalline silicon (polysilicon). The p-type semiconductor layer 122 is doped, for example, with boron (B) to form a p+ region. The p-type semiconductor layer 122 is, for example, 40 nm to 50 nm in thickness. In the present embodiment, this p-type semiconductor layer 122 serves as a lower electrode for extraction of a signal charge and is connected to a storage node N which will be described later (the p-type semiconductor layer 122 serves as the storage node N). It should be noted, however, that if a signal is extracted from the n-type semiconductor layer 124, the p-type semiconductor layer 122 may be connected to a power interconnect (terminal 133 which will be described later) used to supply a reference potential for photoelectric conversion as will be described later. It should be noted that although a description will be given in the present embodiment by taking, as an example, a case in which the p-type semiconductor layer 122 is made of polycrystalline silicon, the p-type semiconductor layer 122 may be made of microcrystalline silicon.

The first and second interlayer insulating films 112A and 112B are formed, for example, by stacking insulating films such as silicon oxide and silicon nitride films. If the photodiode 1 is used in each of the pixels of the photoelectric converter, for example, the same films 112A and 112B may be common layers serving also as an interlayer insulating film of the transistor provided in the same pixel.

The i-type semiconductor layer 123 includes, for example, a non-doped intrinsic semiconductor layer or other semiconductor layer lower in electrical conductivity than the p-type semiconductor layer 122 and n-type semiconductor layer 124 and is made, for example, of amorphous silicon. The i-type semiconductor layer 123 is, for example, 400 nm to 1000 nm in thickness. However, the thicker the i-type semiconductor layer 123, the higher the optical sensitivity can be enhanced. In particular, the structure having the p-type semiconductor layer 122, i-type semiconductor layer 123 and n-type semiconductor layer 124 stacked vertically one on top of the other as in the present embodiment makes it easier to reserve a large thickness of the i-type semiconductor layer 123 than in the so-called planar structure (structure in which the i-type semiconductor layer is sandwiched between the p- and n-type semiconductor layers). This makes it possible to provide higher optical sensitivity than in the planar structure.

The n-type semiconductor layer 124 is made, for example, of amorphous silicon to form an n+ region. In the present embodiment, the n-type semiconductor layer 124 is connected, for example, to the power interconnect (terminal 133 which will be described later) used to supply a reference potential for photoelectric conversion via the upper electrode 125. It should be noted, however, that if a signal is extracted from the n-type semiconductor layer 124 as will be described later, the n-type semiconductor layer 124 may be connected to the storage node N which will be described later (the n-type semiconductor layer 124 may serve as the storage node N). The n-type semiconductor layer 124 is, for example, 10 nm to 50 nm in thickness.

The upper electrode 125 includes, for example, a transparent conductive film made of ITO (Indium Tin Oxide) or other material. The surface of the same electrode 125 serves as a light-receiving surface.

(Light-shielding Layer 120A)

In the photodiode 1, a light-shielding layer 120A is provided in a region between the substrate 11 and p-type semiconductor layer 122 and opposed, for example, to the p-type semiconductor layer 122. More specifically, the light-shielding layer 120A is arranged in a selective region on the substrate 11, and the insulating film 121 is provided in such a manner as to cover the light-shielding layer 120A. The p-type semiconductor layer 122 is provided on the insulating film 121 to be opposed to the light-shielding layer 120A. The insulating film 121 is a single-layer film that includes, for example, one of silicon oxide, silicon oxynitride and silicon nitride films or a laminated film that includes two or more of the above films. If the photodiode 1 is used, for example, in each of the pixels of the photoelectric converter, the insulating film 121 may serve also as the gate insulating film of the transistor provided in the same pixel.

The light-shielding layer 120A is made of a material capable of blocking (absorbing or reflecting) visible light rather than passing it (having light-shielding capability). If the photodiode 1 is used, for example, in each of the pixels of the photoelectric converter, it is preferred that the light-shielding layer 120A should be provided in the same layer 120A and be made of the same material as the gate electrode of the transistor provided in the same pixel. The reason for this is that the light-shielding layer 120A and gate electrode can be formed together in the same step. Further, it is preferred that the light-shielding layer 120A should be made of a high melting-point material because, although, described in detail later, heat resistance is necessary during laser annealing and other treatment processes adapted to form the p-type semiconductor layer 122. Among such metallic materials are molybdenum (Mo), tungsten (W), tantalum (Ta) and chromium (Cr).

Although arranged to be opposed to the p-type semiconductor layer 122 in the present embodiment, this light-shielding layer 120A should preferably be provided in the following region. That is, although the first interlayer insulating film 112A has the contact hole H1 opposed to the p-type semiconductor layer 122 as described above, it is preferred that a seating surface D of the light-shielding layer 120A should be as large as or larger than an opening 122H of the contact hole H1 on the side of the p-type semiconductor layer 122. In other words, the area of the light-shielding layer 120A at its base is acceptably equal to or larger than the area of the opening of the contact hole H1 on the side of the p-type semiconductor layer 122. Further, although this light-shielding layer 120A has tapers 120a1 at its ends, it is more preferred that e light-shielding layer 120A should be large enough so that the tapers 120a1 do not partially overlap the opening 122H. Although described in detail later, the reason for this is that a polycrystalline silicon layer with a more uniform film quality is easier to form in the laser annealing step adapted to form the p-type semiconductor layer 122.

It is preferred that the light-shielding layer 120A should be maintained at the same potential as the p-type semiconductor layer 122 because the coupling with the p-type semiconductor layer 122 suppresses parasitic capacitance. It is only necessary, for example, for the light-shielding layer 120A and p-type semiconductor layer 122 to be electrically connected together via an unshown interconnect layer. It should be noted that although not specifically limited, the thickness of the light-shielding layer 120A is set properly according to the light-shielding capability of the material making up the light-shielding layer 120A. Alternatively, if formed in the same step as for the gate electrode of the transistor, the light-shielding layer 120A is as thick as the gate electrode thereof.

[Manufacturing Method]

The photodiode 1 configured as described above can be manufactured, for example, in the following manner. FIGS. 2A to 2M illustrate the manufacturing method of the photodiode 1 in the order of steps.

Figure 2A:
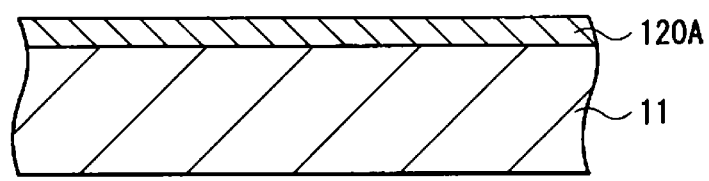
FIGS. 2A to 2M are cross-sectional views illustrating a manufacturing method of the photodiode shown in FIG. 1.
Figure 2B:
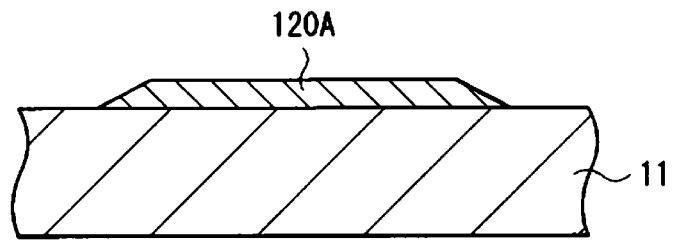

That is, the light-shielding layer 120A is formed first in a selective region on the substrate 11. More specifically, the light-shielding layer 120A made of the above material is formed over the entire surface of the substrate 11 as illustrated in FIG. 2A. It should be noted that if, at this time, the light-shielding layer 120A is formed in the same step as the gate electrode of the transistor, the gate electrode material is formed with a given thickness, for example, by sputtering. Next, the formed film is patterned by dry or wet etching using photolithography as illustrated in FIG. 2B, thus forming the light-shielding layer 120A.

Figure 2C:
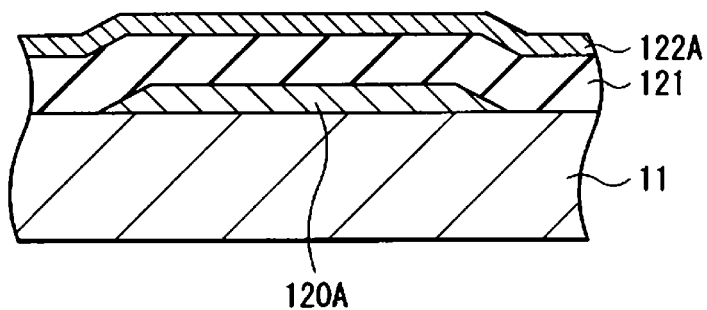

Next, as illustrated in FIG. 2C, the insulating film 121 made of the above material is formed, for example, by CVD (Chemical Vapor Deposition) in such a manner as to cover the light-shielding layer 120A. Then, an amorphous silicon (α-Si) layer 122A is formed on the insulating film 121, for example, by CVD. It should be noted that the insulating film 121 may be a single-layer film that includes, for example, one of $SiN_x$, $SiO_2$ and so on as described above or a laminated film that includes two or more of the above films. However, if the insulating film 121 includes a laminated film, it is preferred that a $SiN_x$ film should be formed first, followed continuously by a $SiO_2$ film.

Figure 2D:
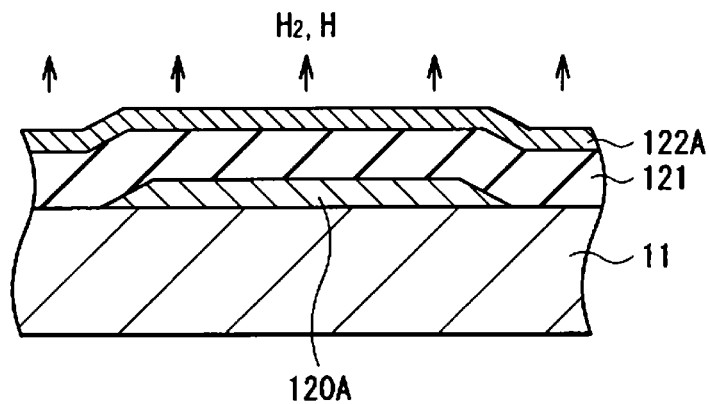
Figure 2E:
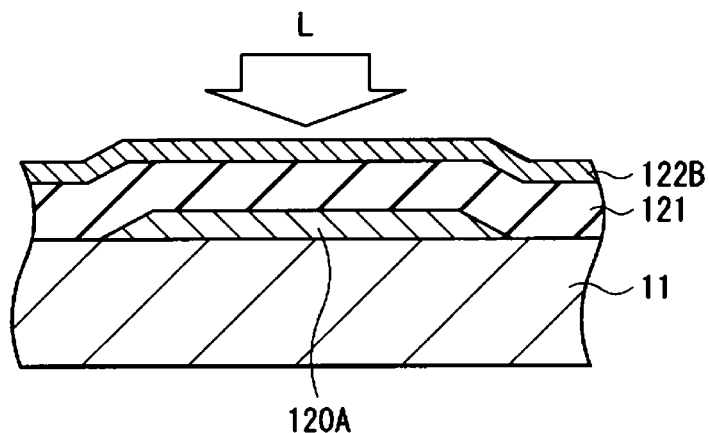

Next, as illustrated in FIG. 2D, dehydrogenation annealing is performed, for example, at a temperature of 400° C. to 450° C. Then, as illustrated in FIG. 2E, the α-Si layer 122A is irradiated with a laser beam L at a wavelength of 308 nm, for example, by excimer laser annealing (ELA), thus polycrystallizing the α-Si layer 122A. As a result, a polysilicon (p-Si) layer 122B is formed on the insulating film 121.

Figure 2F:
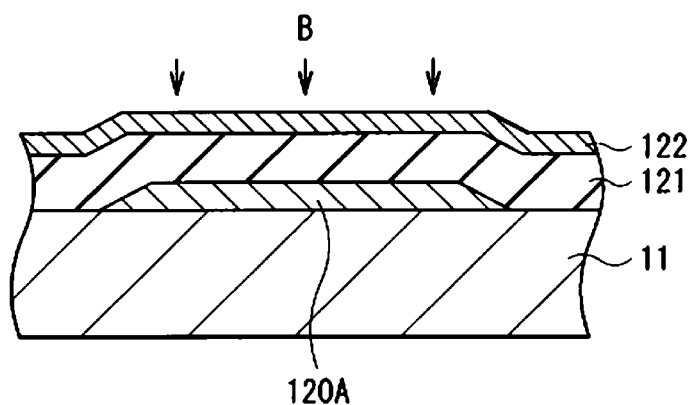
Figure 2G:
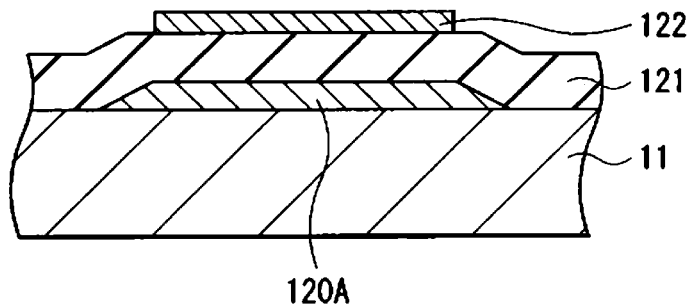

Next, as illustrated in FIG. 2F, the p-Si layer 122B is doped, for example with boron (B) ions, for example, by ion implantation. As a result, the p-type semiconductor layer 122 serving as a p+ region is formed on the insulating film 121. Then, as illustrated in FIG. 2G, the p-type semiconductor layer 122 is patterned in the form of an island, for example, by photolithography.

Figure 2H:
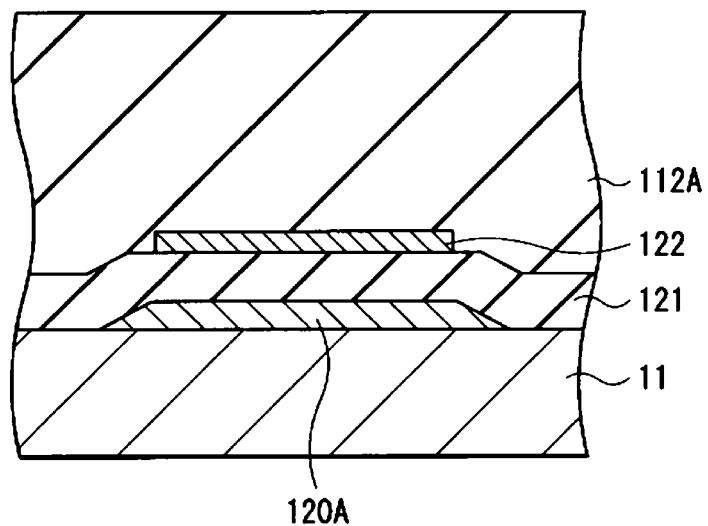
Figure 2I:
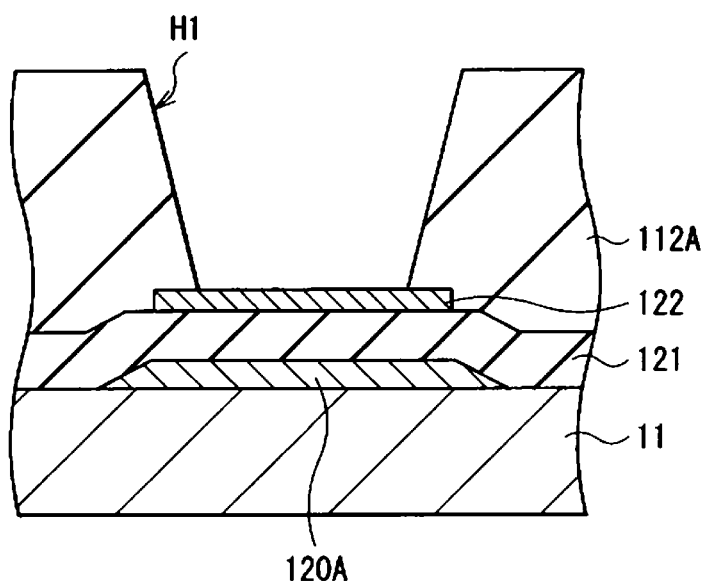

Next, as illustrated in FIG. 2H, the first interlayer insulating film 112A made, for example, of the above material is formed above the entire surface of the substrate 11 (on the p-type semiconductor layer 122 and insulating film 121), for example, by CVD. Next, as illustrated in FIG. 2I, the contact hole H1 is formed in a region of the first interlayer insulating film 112A opposed to the p-type semiconductor layer 122, for example, by dry etching using photolithography.

Figure 2J:
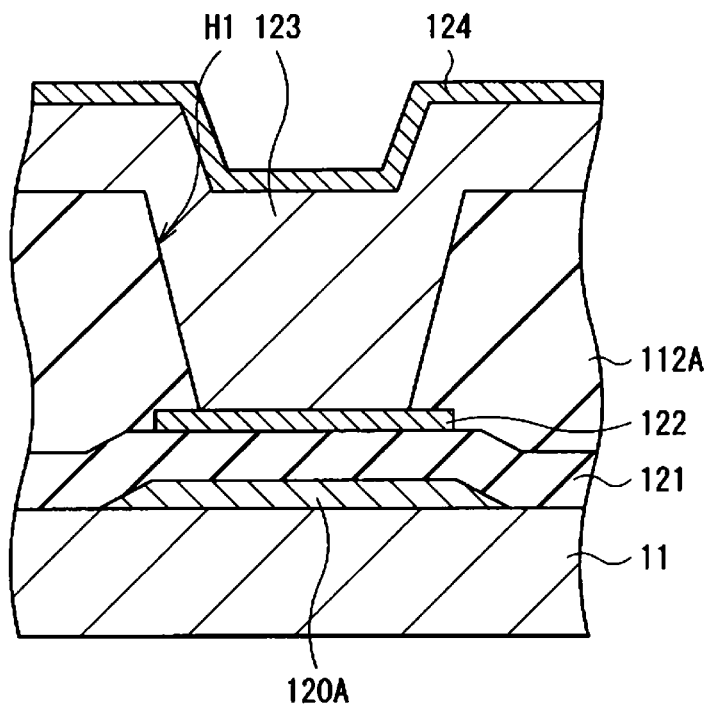
Figure 2K:
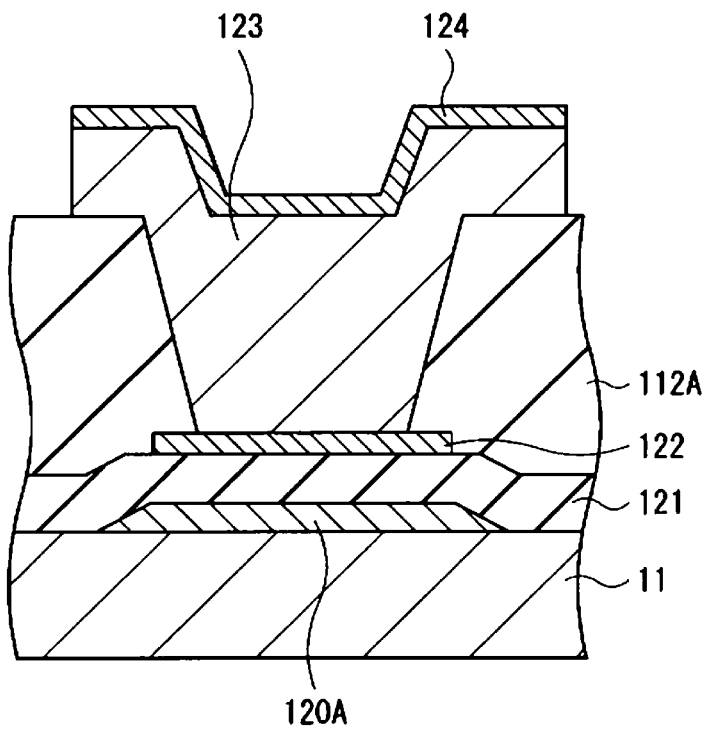

Next, as illustrated in FIG. 2J, the i-type semiconductor layer 123 and n-type semiconductor layer 124 are formed in this order on and above the first interlayer insulating film 112A, for example, by CVD. As a result, the i-type semiconductor layer 123 and n-type semiconductor layer 124 are formed respectively on and above the p-type semiconductor layer 122 in such a manner as to fill the contact hole H1 of the first interlayer insulating film 112A. Then, as illustrated in FIG. 2K, the i-type semiconductor layer 123 and n-type semiconductor layer 124 are patterned in a given form, for example, by photolithography.

Figure 2L:
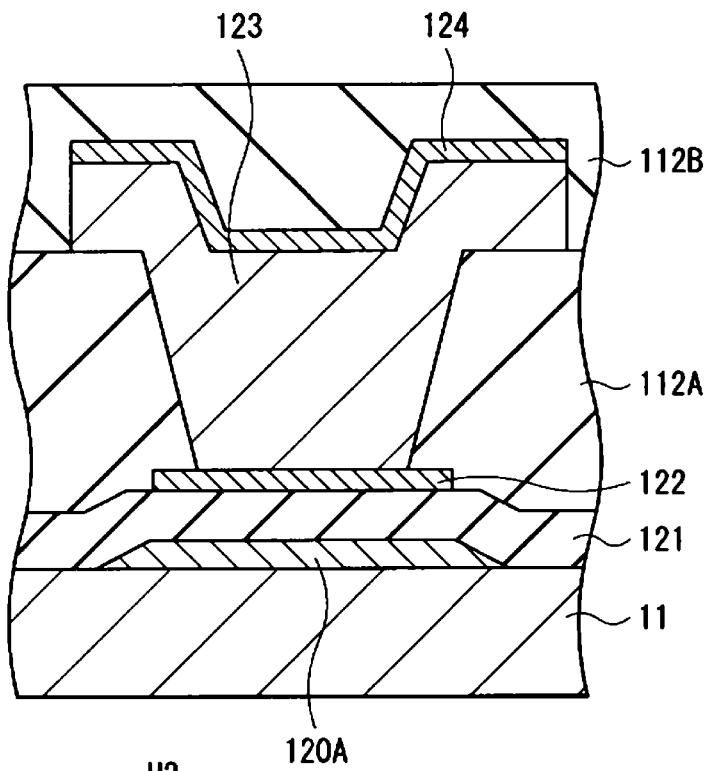
Figure 2M:
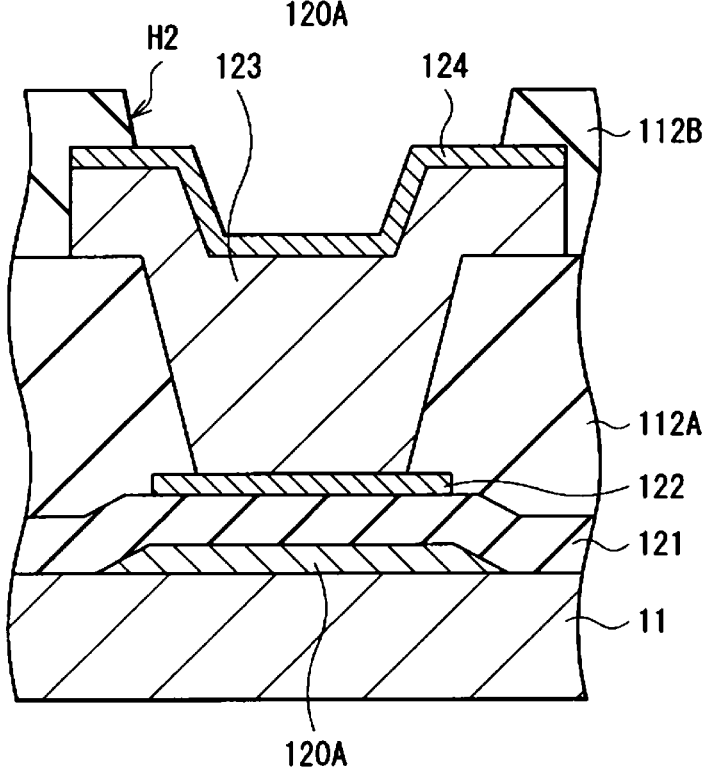

Next, as illustrated in FIG. 2L, the second interlayer insulating film 112B made of the above material is formed above the entire surface of the substrate 11 (on the n-type semiconductor layer 124 and first interlayer insulating film 112A), for example, by CVD. Then, as illustrated in FIG. 2M, the contact hole H2 is formed in a region of the second interlayer insulating film 112B opposed to the n-type semiconductor layer 124, for example, by dry etching using photolithography.

Finally, the upper electrode 125 made of the above material is formed on the n-type semiconductor layer 124 exposed from the second interlayer insulating film 112B by the contact hole H2, for example, by sputtering. This completes the manufacturing of the photodiode 1 shown in FIG. 1.

[Action and Effect]

When the photodiode 1 is supplied with a given potential from an unshown power interconnect via the upper electrode 125, light entering from the side of the upper electrode 125 is absorbed primarily by the i-type semiconductor layer 123, producing carriers and converting light into a signal charge commensurate with the amount of absorbed light (received light). The signal charge produced by this photoelectric conversion is stored, for example, in the p-type semiconductor layer 122 and extracted therefrom as a photocurrent.

In the present embodiment, the p-type semiconductor layer 122 serves as a lower electrode for extraction of a signal charge as described above. The reason for this is that because the p-type semiconductor layer 122 is made of low-resistance polycrystalline silicon, the p-type semiconductor layer 122 is fully capable of serving as an electrode. This eliminates the need to provide a separate lower electrode in the photodiode 1.

Figure 3:
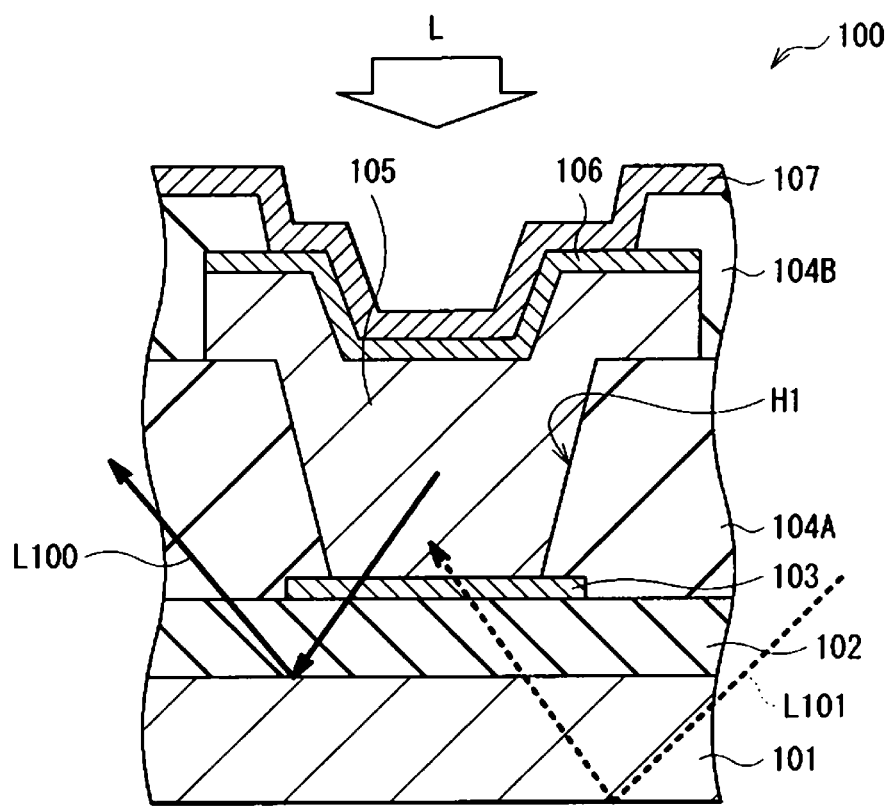
FIG. 3 is a schematic cross-sectional view for describing the light receiving operation of a photodiode according to a comparative example.

Here, FIG. 3 illustrates a cross-sectional configuration of a photodiode according to a comparative example of the present embodiment. A photodiode 100 is a PIN photodiode as is the photodiode 1 according to the present embodiment, having a p-type semiconductor layer 103, i-type semiconductor layer 105 and n-type semiconductor layer 106 stacked in this order from the side of a substrate 101. More specifically, the p-type semiconductor layer 103 is provided in a selective region above the substrate 101. A first interlayer insulating film 104A is provided that has the contact hole H1 opposed to the p-type semiconductor layer 103. The i-type semiconductor layer 105 is provided on the p-type semiconductor layer 103 in such a manner as to fill the contact hole H1 of the first interlayer insulating film 104A. The n-type semiconductor layer 106 is formed on the i-type semiconductor layer 105. A second interlayer insulating film 104B is provided on the n-type semiconductor layer 106 and first interlayer insulating film 104A. The second interlayer insulating film 104B has the contact hole H2 formed to be opposed to the n-type semiconductor layer 106. An upper electrode 107 is connected on the n-type semiconductor layer 106 via the contact hole H2. In the configuration as described above, the p-type semiconductor layer 103 is made of polycrystalline silicon, thus allowing for the p-type semiconductor layer 103 to serve as a lower electrode for extraction of a signal charge. It should be noted, however, that, in the comparative example, the p-type semiconductor layer 103 is provided above the substrate 11 with an insulating film 102 sandwiched therebetween and that the light-shielding layer 120A is not provided as in the present embodiment.

In the photodiode 100 according to the comparative example configured as described above, the light beam L entering from the side of the upper electrode 107 is absorbed, for example, by the i-type semiconductor layer 105, thus generating a signal charge. However, because polycrystalline silicon making up the p-type semiconductor layer 103 is transparent, a light beam (L100), i.e., part of the incident light beam L not absorbed by the i-type semiconductor layer 105, is reflected, for example, by the substrate 11 after transmitting through the p-type semiconductor layer 103, thus ending up as stray light. On the other hand, an undesired light beam (L101) may enter the photodiode 100 from other region (e.g., from the substrate 11) via the p-type semiconductor layer 103. These light beams L100 and L101 end up as optical noise, resulting in crosstalk between adjacent pixels if the photodiode 100 is provided, for example, in each of the pixels of the photoelectric converter.

Figure 4:
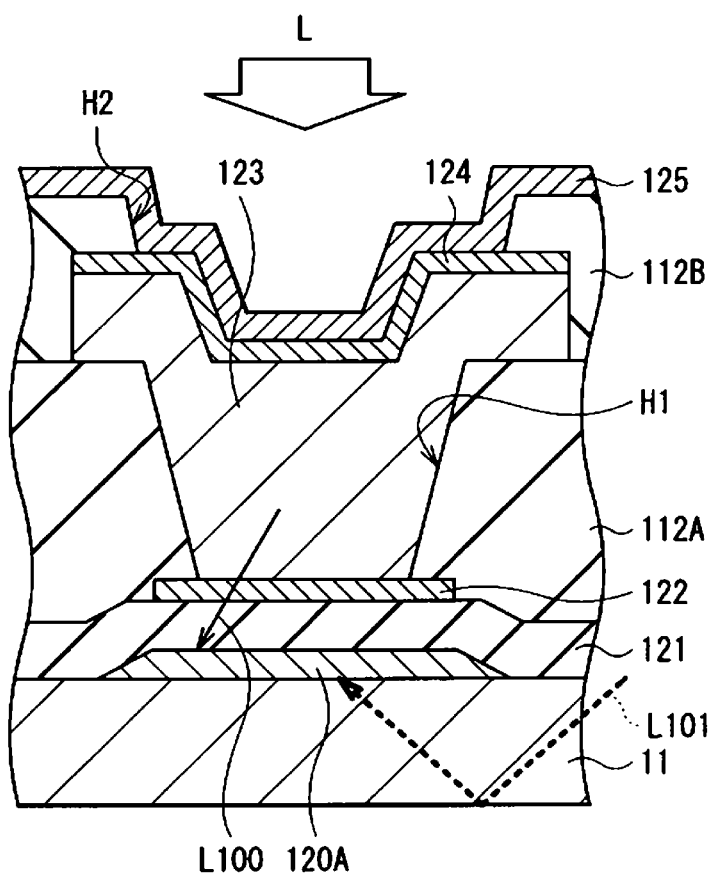
FIG. 4 is a schematic cross-sectional view for describing the light receiving operation of the photodiode shown in FIG. 1.

In contrast, the light-shielding layer 120A is provided between the p-type semiconductor layer 122 and substrate 11 in the present embodiment. Therefore, of the light beam L entering from the upper electrode 125, the partial light beam (L100) not absorbed by the i-type semiconductor layer 123 transmits through the p-type semiconductor layer 122 but is blocked by the light-shielding layer 120A as illustrated, for example, in FIG. 4. As a result, the light beam L100 does not diffuse to other regions. On the other hand, the light beam proceeding from the side of the substrate 11 toward the p-type semiconductor layer 122 is also blocked by the light-shielding layer 120A. This suppresses the entry and exit of undesired light (optical noise) via the p-type semiconductor layer 122. In addition, light reflected by the light-shielding layer 120A returns to and is absorbed by the i-type semiconductor layer 123, thus providing improved sensitivity.

Figure 5A:
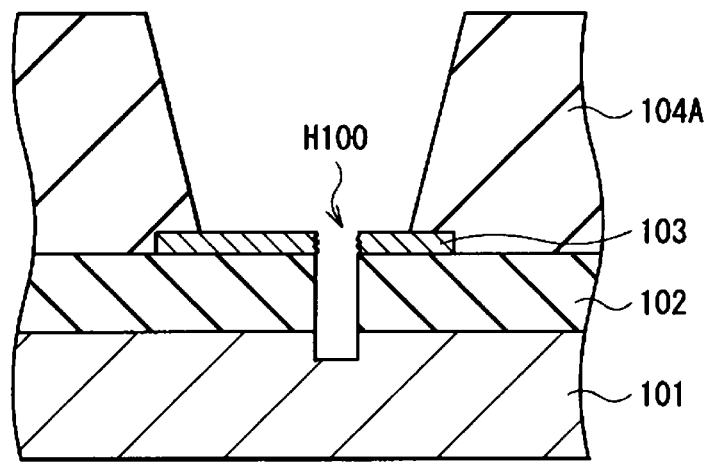
FIGS. 5A and 5B are schematic cross-sectional views for describing other effect achieved by the photodiode shown in FIG. 1.
Figure 5B:
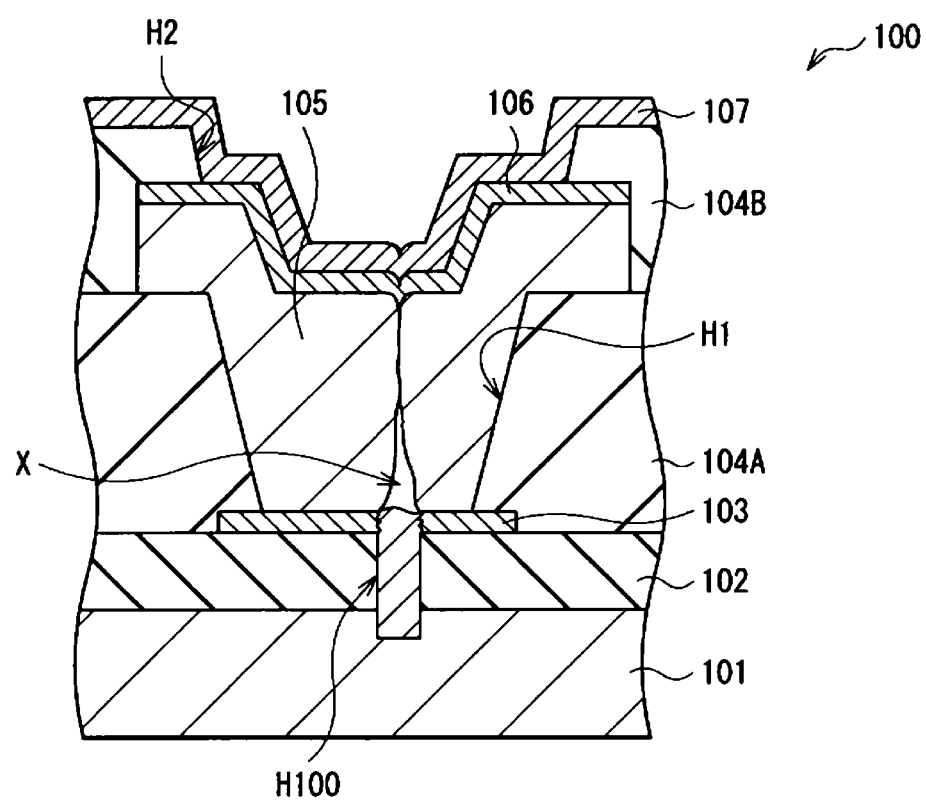

Further, providing the light-shielding layer 120A has the following advantage. FIGS. 5A and 5B schematically illustrate the cross-sectional structure of the photodiode 100 according to the comparative example. Here, when the p-type semiconductor layer 103 is formed, amorphous silicon is polycrystallized, for example, by ELA in the same manner as in the above process. In the comparative example, however, microcrystalline areas (lattice defects) may develop in part of the film following ELA. In the presence of microcrystalline areas, holes are formed in these microcrystalline areas in the step adapted to dry-etch the first interlayer insulating film 104A. As illustrated in FIG. 5A, for example, a hole H100 may be formed that penetrates the p-type semiconductor layer 103, insulating film 102 and part of the substrate 101. If the i-type semiconductor layer 105, n-type semiconductor layer 106 and upper electrode 107 are formed successively above the hole H100 by CVD, a seam (cavity) X will develop, for example, in the i-type semiconductor layer 105.

In contrast to the comparative example in which a defect, i.e., the development of the seam X in the p-type semiconductor layer 103, occurs, the light-shielding layer 120A suppresses the development of the seam X in the present embodiment. That is, in the present embodiment, laser radiation using the light-shielding layer 120A as described above during ELA allows for easy formation of polycrystalline silicon with minimal lattice defects. This suppresses the formation of holes caused by dry etching during the formation of the first interlayer insulating film 112A, thus suppressing the development of the seam X. Further, if the light-shielding layer 120A and transistor gate electrode are formed in the same step, crystals are formed with a uniform grain size as in the channel layer, thus ensuring freedom from microcrystals.

FIG. 6 illustrates diode characteristics with and without the light-shielding layer 120A (comparative example). It is clear from FIG. 6 that there is a significant difference in dark current. Therefore, providing the light-shielding layer 120A suppresses not only optical noise during light reception but also the development of seams caused by lattice defects in polycrystalline silicon, thus suppressing the increase in dark current.

As described above, in the present embodiment, the p-type semiconductor layer 122, i-type semiconductor layer 123 and n-type semiconductor layer 124 are stacked in this order above the substrate 11, with the light-shielding layer 120A sandwiched between the p-type semiconductor layer 122 and substrate 11. This blocks not only light emitted toward the substrate 11 through the i-type semiconductor layer 123 and n-type semiconductor layer 124 of all the light entering from the n-type semiconductor layer 124 but also that proceeding from the side of the substrate 11 toward the p-type semiconductor layer 122. That is, this suppresses the entry and exit of undesired light (optical noise) via the p-type semiconductor layer 122, thus contributing to reduced susceptibility to optical noise.

A description will be given next of a modification example (modification example 1) of the embodiment. It should be noted that like components to those of the embodiment are denoted by the same reference numerals, and the description thereof is omitted as appropriate.

MODIFICATION EXAMPLE 1

Figure 7:
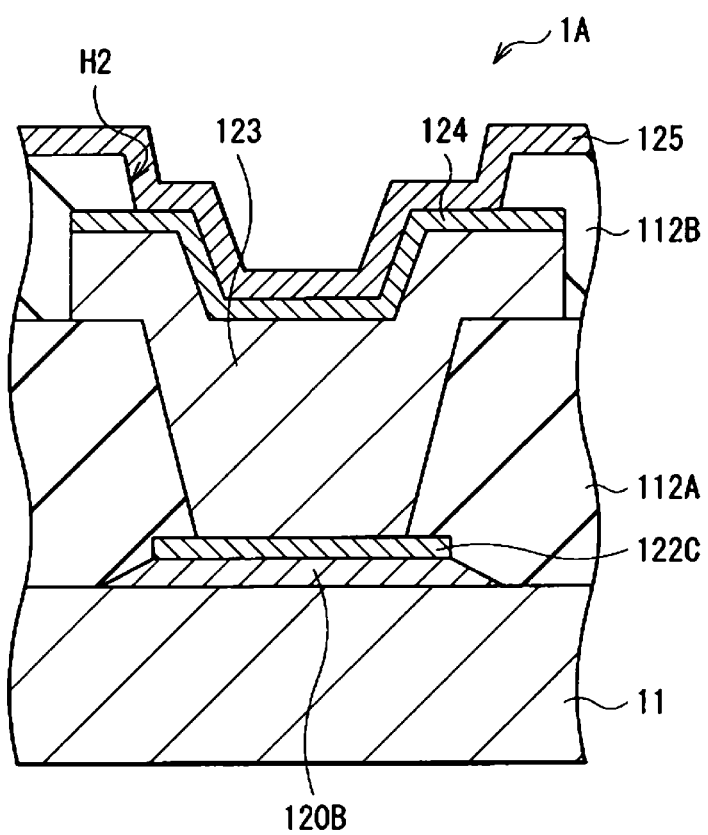
FIG. 7 is a cross-sectional view illustrating a rough configuration of a photodiode according to modification example 1.

FIG. 7 illustrates a cross-sectional configuration of a photodiode (photodiode 1A) according to this modification example. The photodiode 1A is a PIN photodiode as is the photodiode 1 according to the embodiment, having a p-type semiconductor layer 122C, the i-type semiconductor layer 123 and n-type semiconductor layer 124 stacked in this order from the side of the substrate 11. More specifically, the p-type semiconductor layer 122C is provided in a selective region above the substrate 11. The first interlayer insulating film 112A is provided that has the contact hole H1 opposed to the p-type semiconductor layer 122C. The second interlayer insulating film 112B having the contact hole H2 is provided on the n-type semiconductor layer 124 and first interlayer insulating film 112A. The upper electrode 125 is connected on the n-type semiconductor layer 124 via the contact hole H2. Further, a light-shielding layer 120B is provided between the p-type semiconductor layer 122C and substrate 11.

It should be noted that, in the present modification example, the p-type semiconductor layer 122C is made of microcrystalline silicon. It was mentioned earlier that the p-type semiconductor layer 122 may be made of microcrystalline silicon in the embodiment. If the p-type semiconductor layer is made of microcrystalline silicon as in this case, the insulating film 121 is no longer necessary, thus allowing for the light-shielding layer 120B to serve as a lower electrode for extraction of a signal charge. The light-shielding layer 120B is made of a material similar to that of the light-shielding layer 120A in the embodiment.

If made of microcrystalline silicon as described above, the p-type semiconductor layer 122C may be provided on the light-shielding layer 120B serving as a lower electrode. The photodiode configured as described above also provides an advantageous effect equivalent to that provided by the above embodiment.

APPLICATION EXAMPLE

Figure 8:
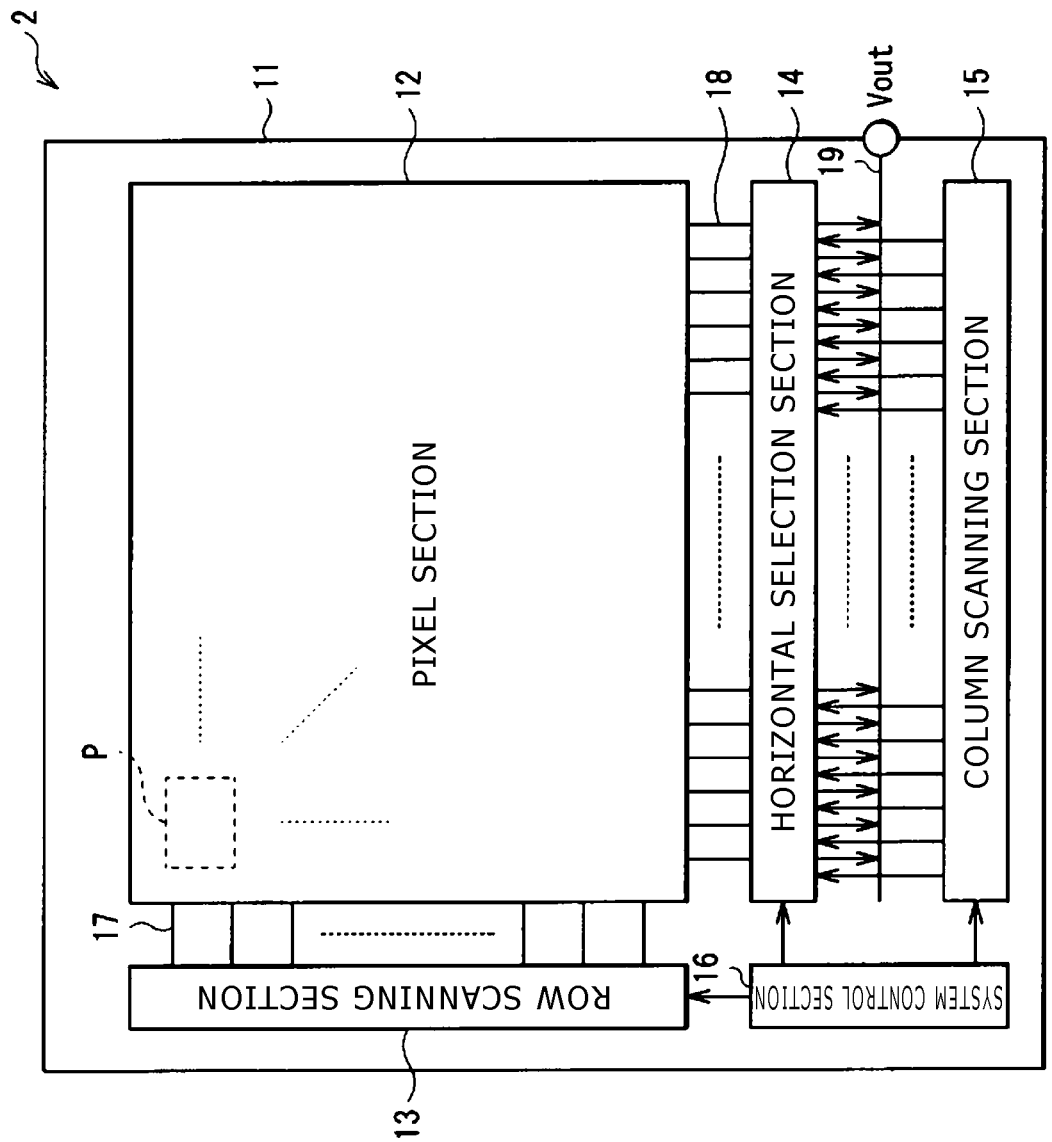
FIG. 8 is a functional block diagram illustrating an overall configuration of a photoelectric converter according to an application example.

FIG. 8 illustrates an overall configuration of a photoelectric converter (photoelectric converter 2) using the photodiode described in the above embodiment and modification example in each of the pixels. The photoelectric converter 2 is used, for example, in a radiographic imager, thus allowing for visible light converted by a scintillator from radiation, typically, $\alpha$, $\beta$, $\gamma$ and X rays, to be received and image information based on radiation to be obtained in the form of an electric signal. This radiographic imager is designed for use in medical sector as well as for an X-ray imager for non-destructive inspection of baggage and other objects. Further, the photoelectric converter 2 is applicable to both indirect and direct conversion FPDs (Flat Panel Detector). Alternatively, the photoelectric converter 2 is used, for example, in a so-called optical touch sensor capable of detecting the presence or absence of touch by a finger or stylus based on an electric signal obtained by photoelectric conversion.

This photoelectric converter has, on the substrate 11, not only a pixel section 12 serving as an imaging area but also, for example, peripheral circuits (drive circuits) in the surrounding region. The peripheral circuits include, for example, a row scanning section 13, horizontal selection section 14, column scanning section 15 and system control section 16.

The pixel section 12 includes unit pixels P (hereinafter may be simply referred to as the pixels) that are, for example, arranged two-dimensionally in a matrix form. Each of the unit pixels P includes the photodiode 1 described above (or photodiode 1A or 1B and the same hereinafter) and the transistor (transistors Tr1 to Tr3 or 111B which will be described later). For example, pixel drive lines 17 (more specifically, row selection line and reset control line) are disposed for each row of the unit pixels P, and a vertical signal line 18 is disposed for each column of the unit pixels P. The pixel drive lines 17 are used to transmit drive signals adapted to read signals from the pixels. One end of each of the pixel drive lines 17 is connected to the output terminal associated with one of the rows of the row scanning section 13.

In the present embodiment, the photodiode 1 and transistor are arranged side by side on the substrate 11, and some layers thereof (insulating film 121 and first and second interlayer insulating films 112A and 112B) are common layers shared between them. The insulating film 121 of the photodiode 1 serves also as a gate insulating film of the transistor 111B. A description will be given later of the specific structures of the photodiode 1 and transistor 111B.

The row scanning section 13 is a pixel drive section that includes, for example, a shift register and address decoder and drives the pixels P of the pixel section 12, for example, on a row-by-row basis. A signal output from each of the pixels P in the pixel row selected and scanned by the row scanning section 13 is supplied to the horizontal selection section 14 through one of the vertical signal lines 18. The horizontal selection section 14 includes an amplifier, horizontal selection switch and other components that are provided for each of the vertical signal lines 18.

The column scanning section 15 includes, for example, a shift register and address decoder and drives the horizontal selection switches of the horizontal selection section 14 one at a time in sequence while at the same time scanning these switches. Thanks to the selection and scanning by the column scanning section 15, the signals of the pixels transmitted through the vertical signal lines 18 are output to horizontal scanning lines 19 in sequence and transmitted externally from the substrate 11 through the horizontal scanning lines 19.

The circuit portion made up of the row scanning section 13, horizontal selection section 14, column scanning section 15 and horizontal scanning lines 19 may be formed directly on the substrate 11. Alternatively, this circuit portion may be arranged in an external control IC. Still alternatively, this circuit portion may be formed on other substrate connected, for example, by a cable.

The system control section 16 outputs data such as internal information of the radiographic imager 1 in response to a clock supplied from outside the substrate 11, data specifying an operation mode or other information. The system control section 16 also includes a timing generator adapted to generate various timing signals, thus controlling the driving of the peripheral circuits such as the row scanning section 13, horizontal selection section 14, column scanning section 15.

(Pixel Circuit)

Figure 9:
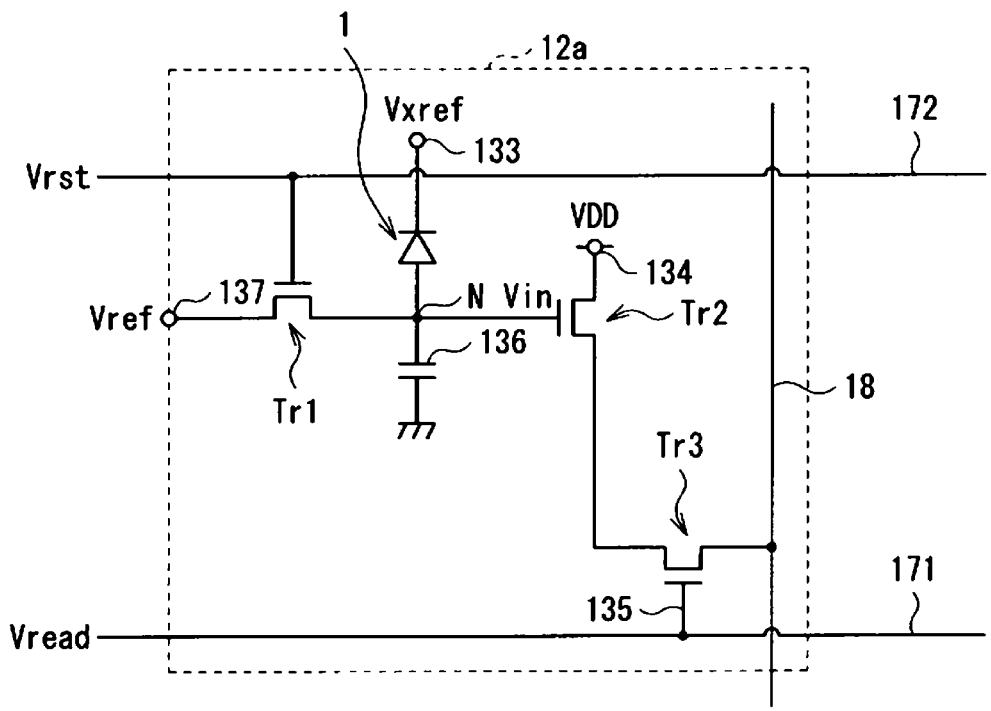
FIG. 9 is an example of a pixel circuit (actively driven) in a pixel section shown in FIG. 8.

The pixel circuit may be actively or passively driven. FIG. 9 is an example of an actively driven pixel circuit (pixel circuit 12a). The pixel circuit 12a includes the photodiode 1, transistors Tr1 to Tr3 (equivalent to the transistor 111B which will be described later), vertical signal line 18 and a row selection line 171 and reset control line 172 serving as the pixel drive lines 17. In this example, a signal charge is extracted from the p side of the photodiode 1 (the p-type semiconductor layer 122 is connected to the storage node N).

One end of the photodiode 1 is, for example, supplied with a reference potential Vxref through a terminal 133, with the other end thereof connected to the storage node N. The storage node N contains a capacitive component 136 so that the signal charge generated by the photodiode 1 is stored in the storage node N. It should be noted that the photodiode 1 may be connected between the storage node N and ground (GND).

The transistor Tr1 is a reset transistor connected between a terminal 137 and the storage node N. The terminal 137 is supplied with the reference potential Vref. The transistor Tr1 turns ON in response to a reset signal Vrst to reset the potential of the storage node N to the reference potential Vref. The transistor Tr2 is a readout transistor that has its gate connected to the storage node N and its drain side terminal to a power source VDD. The transistor Tr2 outputs, in response to a signal charge generated by the photodiode 1, a signal voltage commensurate with the signal charge. The transistor Tr3 is a row selection transistor connected between the source of the transistor Tr2 and the vertical signal line 18 and turns ON in response to a row scanning signal Vread to output the signal from the transistor Tr2 to the vertical signal line 18. The transistor Tr3 may be connected between the drain of the transistor Tr2 and the power source VDD.

Figure 10:
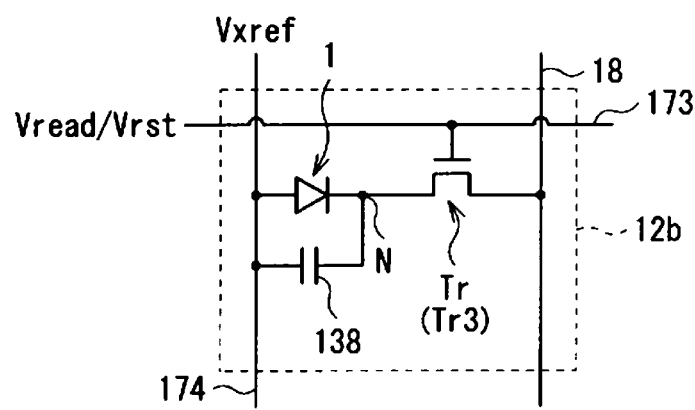
FIG. 10 is an example of a pixel circuit (passively driven) in the pixel section shown in FIG. 8.
Figure 11:
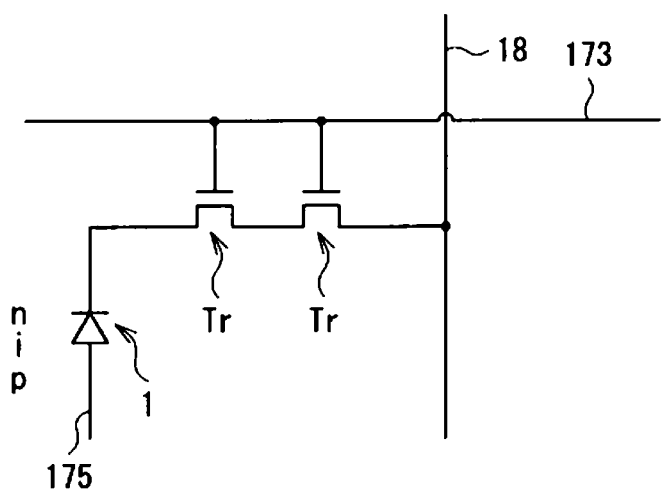
FIG. 11 is another example of the pixel circuit shown in FIG. 10.

FIG. 10 is an example of a passively driven pixel circuit (pixel circuit 12b). In this example, the unit pixel P includes the photodiode 1, a capacitive component 138 and transistor Tr (equivalent to the readout transistor Tr3). The transistor Tr is connected between the storage node N and vertical signal line 18 and turns ON in response to the row scanning signal Vread to output a signal charge stored in the storage node N based on the amount of light received by the photodiode 1 to the vertical signal line 18. In this example, a signal charge is extracted from the n side of the photodiode 1 (the n-type semiconductor layer 124 is connected to the storage node N). On the other hand, FIG. 11 illustrates an example of a so-called double gate structure having the two transistors Tr connected together in series as another example of a passively driven pixel circuit. Although an example is shown here in which the two transistors Tr are connected together in series, the three or more transistors Tr may be connected together in series. It should be noted that the transistors Tr (Tr3) are equivalent to the transistor 111B in the above embodiment and so on.

(Cross-Sectional Configuration of the Photodiode and Transistor)

Figure 12:
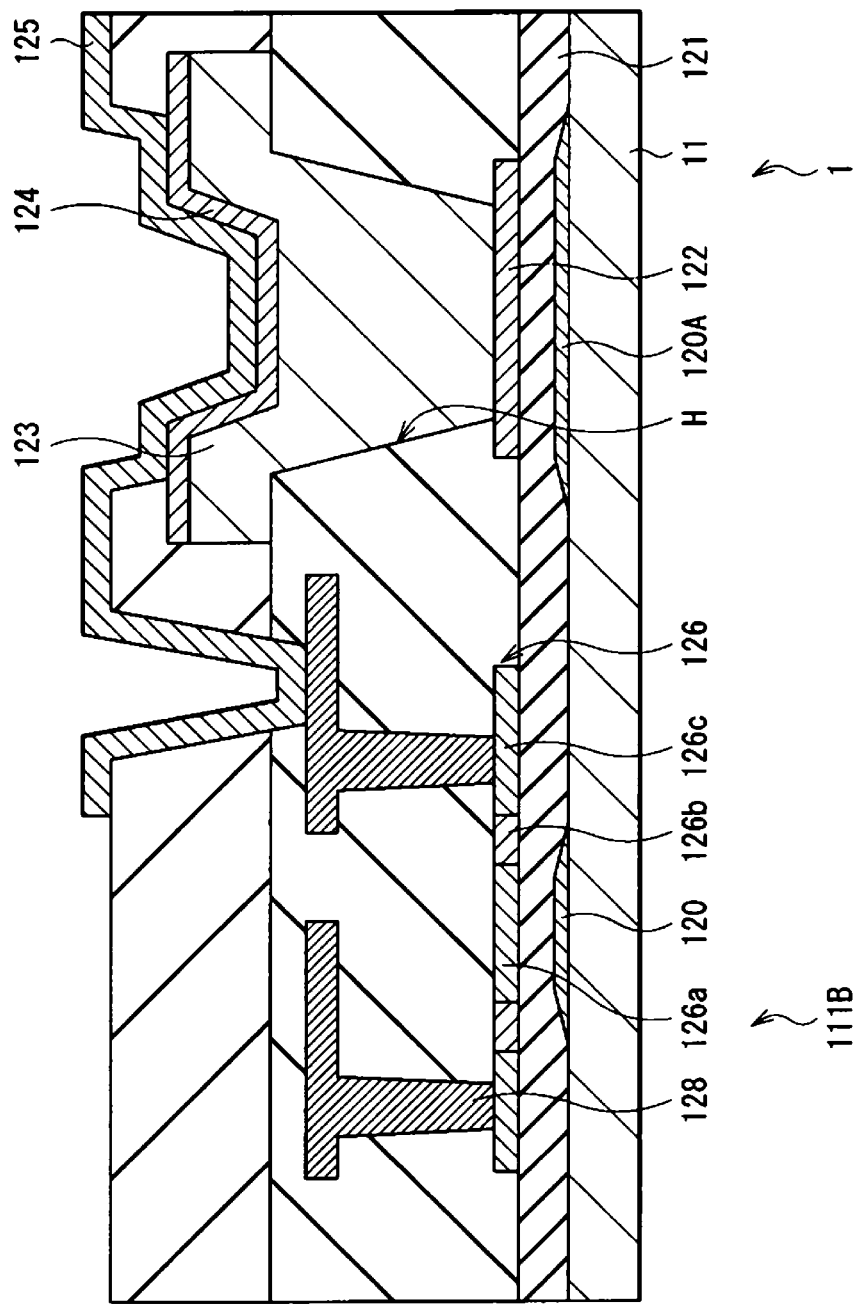
FIG. 12 is a cross-sectional view illustrating a rough configuration of a photodiode and transistor provided in a unit pixel shown in FIG. 8.

FIG. 12 is an example of cross-sectional configuration of the photodiode 1 and transistor 111B provided in the unit pixel P. It should be noted, however, that this configuration example is a case in which the unit pixel P is passively driven as described above, and that the photodiode 1 has the p-type semiconductor layer 122, i-type semiconductor layer 123 and n-type semiconductor layer 124 stacked in this order from the side of the substrate 11, with a signal charge extracted from the n-type semiconductor layer 124 at the top. As illustrated in FIG. 12, the insulating film 121 and first and second interlayer insulating films 112A and 112B are common layers shared by the photodiode 1 and transistor 111B. Further, the light-shielding layer 120A of the photodiode 1 is provided in the same layer as the gate electrode (gate electrode 120) of the transistor 111B, with the upper electrode 125 of the photodiode 1 electrically connected to an interconnect layer 128 of the transistor 111B.

The transistor 111B is, for example, a field effect transistor (FET). In the transistor 111B, a gate electrode 120 is provided in a selective region on the substrate 11, and the insulating film 121 serving as a gate insulating film is formed on the gate electrode 120. A semiconductor layer 126 is formed on the insulating film 121 and includes a channel region 126a, LDD (Lightly Doped Drain) 126b and n+ region (or p+ region) 126c. The semiconductor layer 126 is made, for example, of polycrystalline, microcrystalline or amorphous silicon and preferably of low-temperature polycrystalline silicon (LTPS). Alternatively, the semiconductor layer 126 may be made of an oxide semiconductor such as indium gallium zinc oxide (InGaZnO) or zinc oxide (ZnO). In the first interlayer insulating film 112A provided on the semiconductor layer 126 configured as described above, the interconnect layers 128 (each being either the source or drain electrode) are formed using, for example, Ti, Al, Mo, W or Cr. The interconnect layers 128 are connected to a readout signal line and various interconnects.

It should be noted that although only the single transistor 111B is shown in FIG. 12, the two (or three or more thereof) transistors 111B may be arranged, for example, side by side on the substrate 11 as a configuration example appropriate to the circuit example shown in FIG. 11. On the other hand, the number of gate electrodes provided in the transistor 111B need not always be one. Instead, a so-called dual gate structure may be used in which two gate electrodes are provided vertically (along the thickness).

If the photodiode 1 and transistor 111B are arranged side by side on the substrate 11 as described above, the insulating film 121 may be provided using the gate insulating film of the transistor 111B. On the other hand, if provided in the same layer, the gate electrode 120 and light-shielding layer 120A can be formed together in the same process. Here, it is preferred that the light-shielding layer 120A should be made of a high melting-point material having light-shielding capability. Of the materials having such properties, molybdenum which is further suitable for use as the gate electrode 120 can be used as the light-shielding layer 120A.

It should be noted that if the light-shielding layer 120A and gate electrode 120 are provided in the same layer, it is preferred that the light-shielding layer 120A should be electrically isolated from the gate electrode 120 and provided in a region avoiding the transistor 111B.

In the photoelectric converter 2 configured as described above, the photodiode 1 having the light-shielding layer 120A is provided in each of the pixels, thus suppressing, for example, crosstalk between adjacent pixels. This makes it possible, for example, for a radiographic imager to suppress degradation of captured image quality such as reduction in resolution. On the other hand, this makes it possible for a touch sensor to suppress erroneous detection.

MODIFICATION EXAMPLE 2

Figure 13:
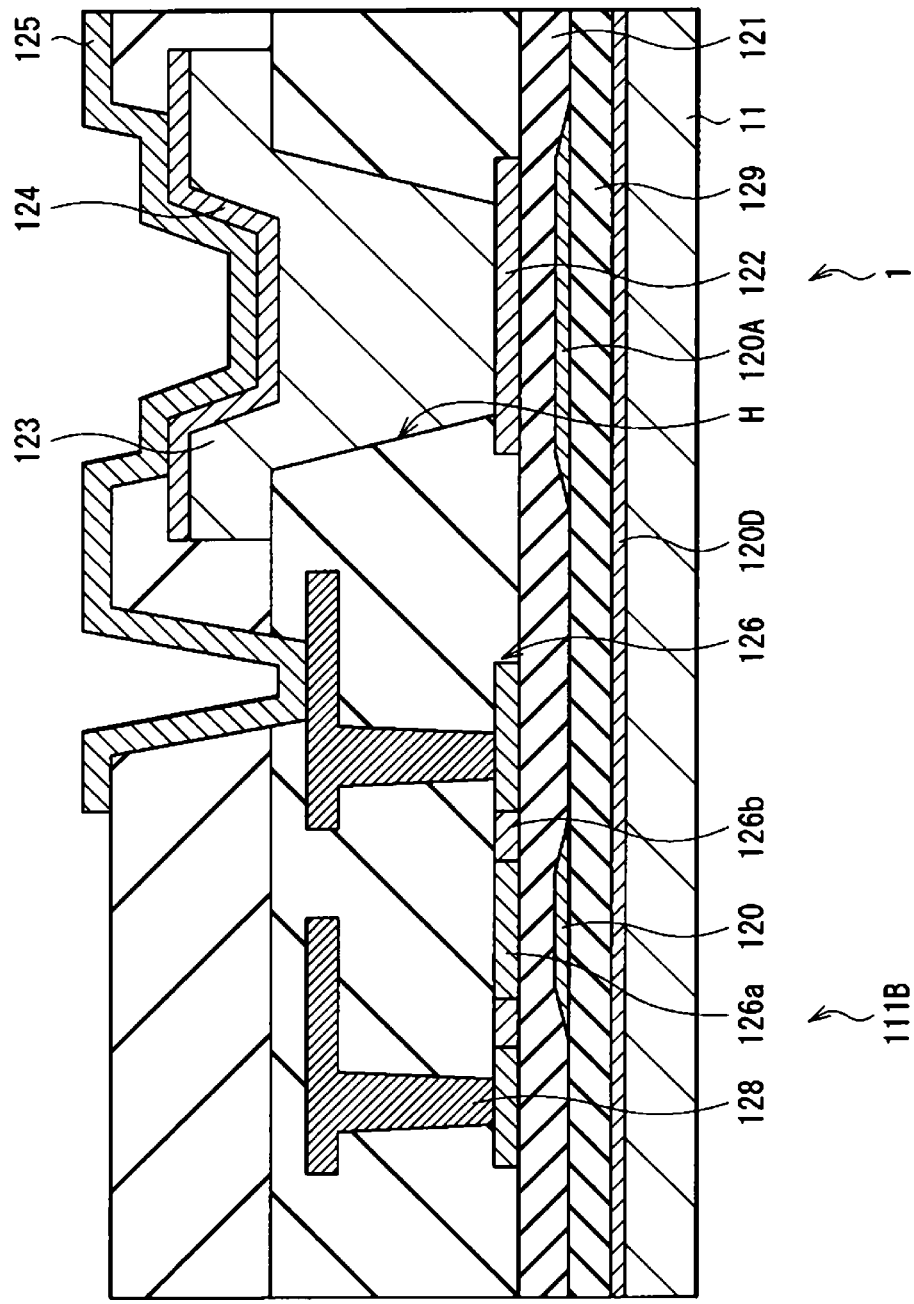
FIG. 13 is a cross-sectional view illustrating a rough configuration of a photodiode and transistor according to modification example 2.

If the photodiode 1 and transistor 111B are arranged side by side in the photoelectric converter as described above, the light-shielding layer (light-shielding layer 120D) need not necessarily be provided in the same layer as the gate electrode 120. Instead, the light-shielding layer may be provided in a different layer from the gate electrode 120. More specifically, the light-shielding layer 120D may be provided in a lower layer than the gate electrode 120 as illustrated in FIG. 13. In this case, the light-shielding layer 120D is provided over the entire surface of the substrate 11, and the gate electrode 120 is provided above the light-shielding layer 120D with an insulating film 129 sandwiched therebetween. It should be noted that an example is shown here in which the pixel circuit is also passively driven as described above.

If the gate electrode 120 and light-shielding layer 120D are provided in different layers as in the present modification example, the light-shielding layer 120D may be disposed over the entire surface of the substrate 11 irrespective of where the transistor 111B is provided. This blocks optical noise more effectively.

MODIFICATION EXAMPLE 3

Figure 14:
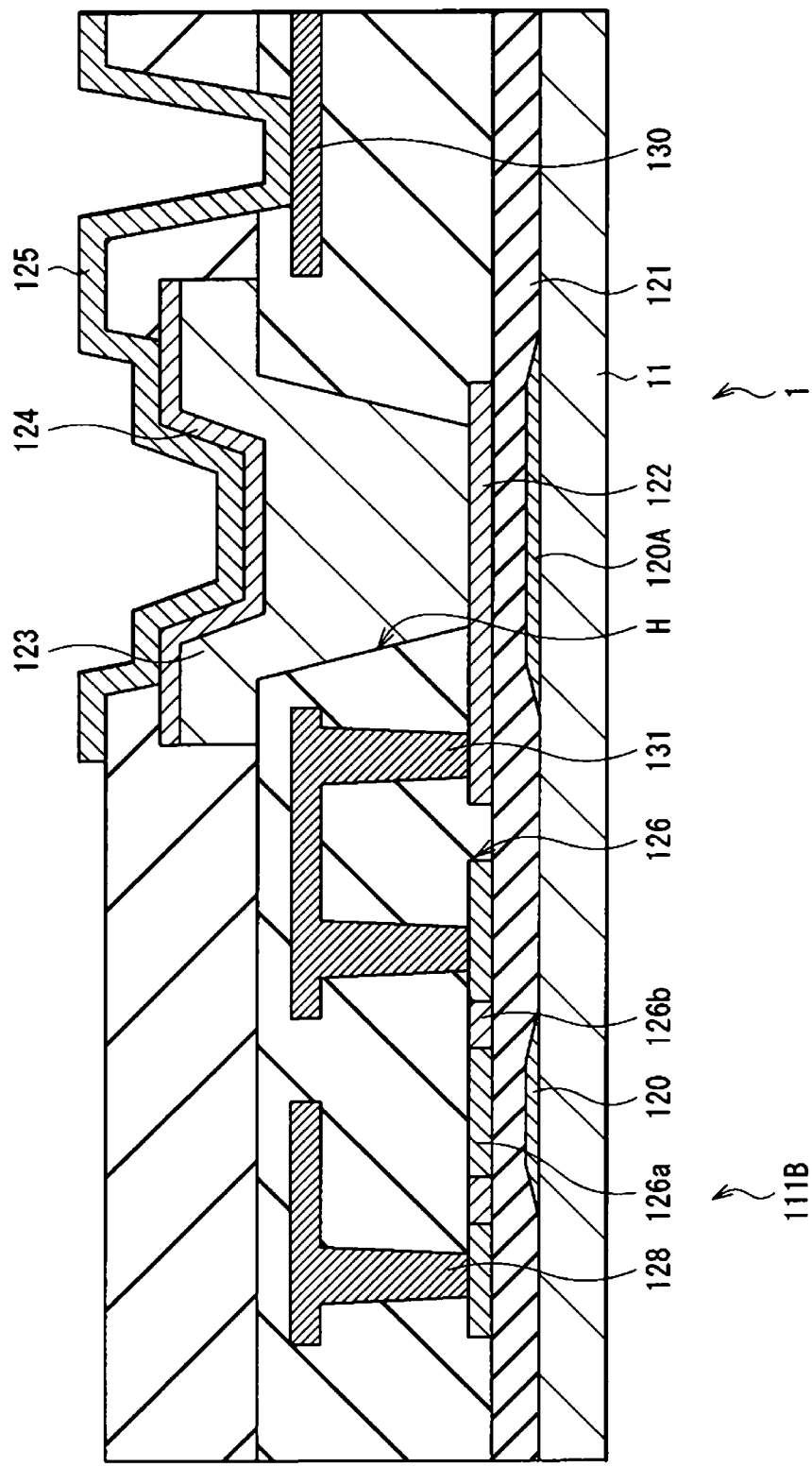
FIG. 14 is a cross-sectional view illustrating a rough configuration of a photodiode and transistor according to modification example 3.
Figure 15:
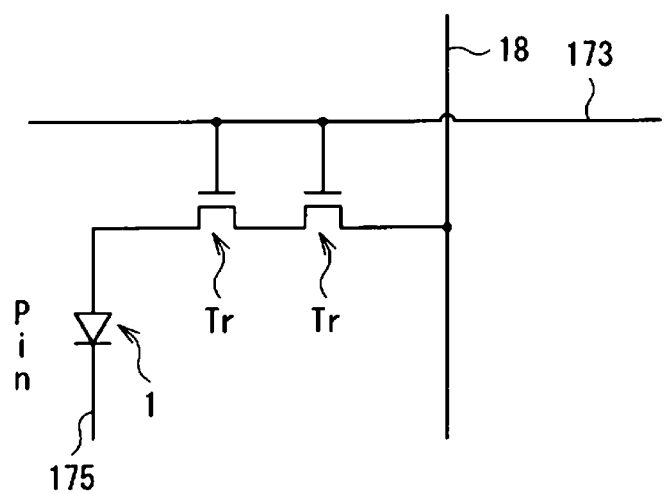
FIG. 15 is an example of a pixel circuit appropriate to the configuration example shown in FIG. 14.

FIG. 14 illustrates an example of cross-sectional configuration of the photodiode 1 and transistor 111B according to modification example 3. FIG. 15 is an example of the pixel circuit thereof. In the present modification example, the p-type semiconductor layer 122 is connected to a node adapted to store a signal charge, and a signal is extracted from the bottom (p-type semiconductor layer 122). As described above, the p-type semiconductor layer 122 is connected to the semiconductor layer 126 of the transistor 111B via an interconnect layer 131, and the n-type semiconductor layer 124 is connected to a power line 175 (not shown in FIG. 14) via the upper electrode 125 and an electrode 130. It should be noted that the power line 175 and vertical signal line 18 are maintained respectively at a positive potential (e.g., 1 V), and 0 V for use in this case.

MODIFICATION EXAMPLE 4

Figure 16:
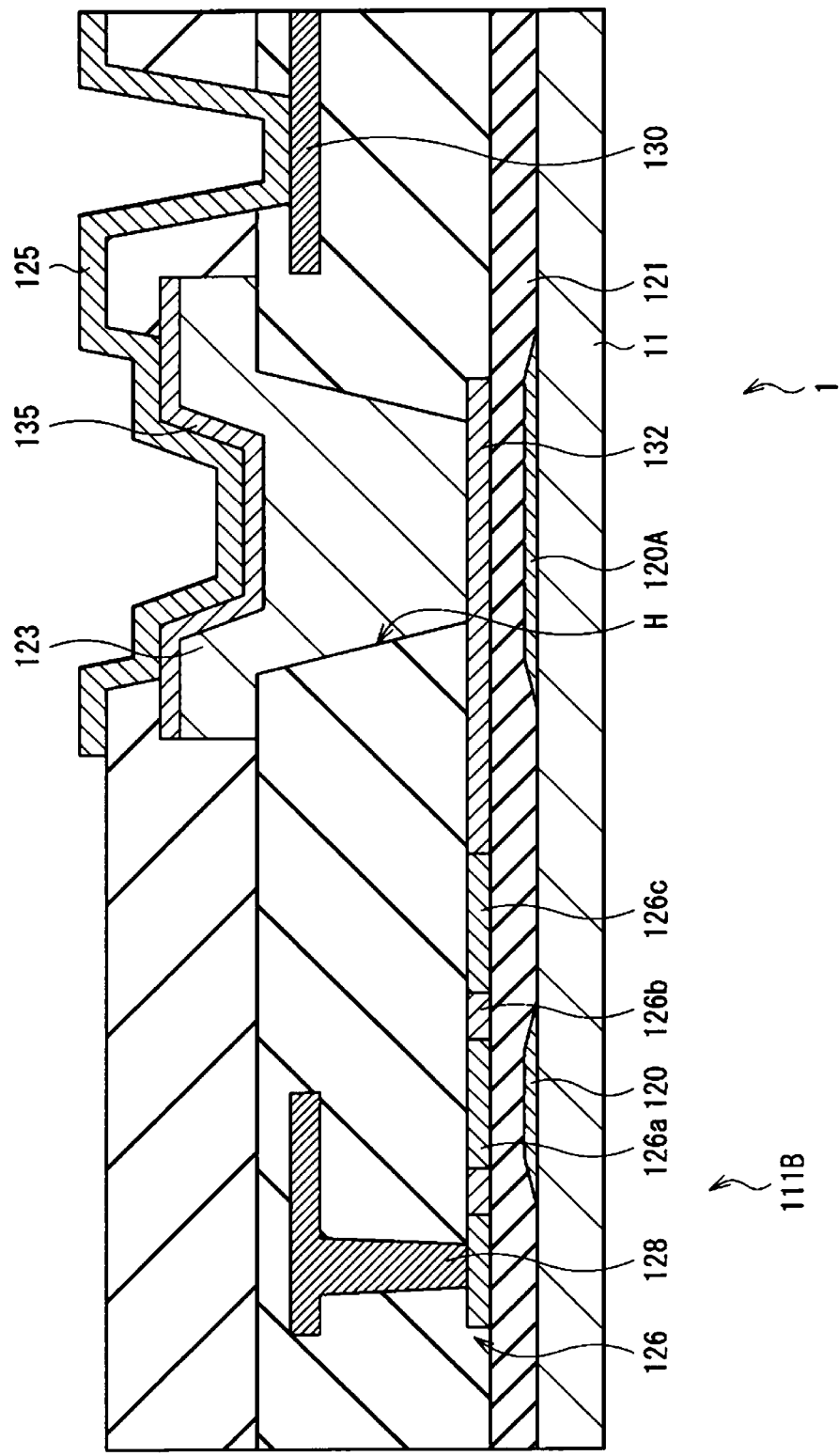
FIG. 16 is a cross-sectional view illustrating a rough configuration of a photodiode and transistor according to modification example 4.

FIG. 16 illustrates an example of cross-sectional configuration of the photodiode 1 and transistor 111B according to modification example 4. Although, in the above application example, the photodiode 1 has the p-type semiconductor layer 122, i-type semiconductor layer 123 and n-type semiconductor layer 124 stacked in this order from the side of the substrate 11, the photodiode 1 may have an n-type semiconductor layer 132, the i-type semiconductor layer 123 and a p-type semiconductor layer 135 stacked in this order from the side of the substrate 11 as illustrated in FIG. 16. Further, if a signal is extracted from the side of the n-type semiconductor layer 132 in this laminated structure, the n-type semiconductor layer 132 is made of polycrystalline silicon (or microcrystalline silicon) and connected to the semiconductor layer 126 of the transistor 111B (more specifically, n+ region 126c). It should be noted that, in order to connect the n-type semiconductor layer 132 and semiconductor layer 126 together, these layers need only be formed directly in contact with each other, and that there is no need to provide an interconnect layer as in the above modification example 3. On the other hand, the p-type semiconductor layer 135 is connected to the power line 175 (not shown in FIG. 16) via the upper electrode 125 and electrode 130. It should be noted that, in the present modification example, the n-type semiconductor layer 132 corresponds to a specific example of a "first semiconductor layer," the p-type semiconductor layer 135 to a specific example of a "second semiconductor layer," and the i-type semiconductor layer 123 to a specific example of a "third semiconductor layer" in the embodiment of the present disclosure.

While the present disclosure has been described by way of the preferred embodiment and modification examples, the substance of the embodiment of the present disclosure is not limited to the above embodiment but may be modified in various ways. In the above modification examples, the side-by-side arrangement of the photodiode 1 and transistor 111B on the substrate 11 was shown by way of example. However, the present disclosure is not limited thereto. Instead, the transistor 111B and photodiode 1 may be, for example, stacked in this order on the substrate 11.

Further, the radiographic imager according to the embodiment of the present disclosure need not include all the components described in the above embodiment. Conversely, the radiographic imager according to the embodiment of the present disclosure may include other layer or layers.

It should be noted that the photoelectric conversion element and photoelectric converter according to the embodiment of the present disclosure may be configured as described below from (1) to (16).

(1) Photoelectric conversion element including a first semiconductor layer of a first conductivity type, a second semiconductor layer of a second conductivity type, a third semiconductor layer of a third conductivity type and a light-shielding layer, with the first semiconductor layer provided above a substrate, the second semiconductor layer provided in a higher layer than the first semiconductor layer, the third semiconductor layer provided between the first and second semiconductor layers and lower in electrical conductivity than the first and second semiconductor layers, and the light-shielding layer provided between the substrate and first semiconductor layer (2) Photoelectric conversion element defined in feature 1 in which the first semiconductor layer is connected to a node adapted to store a signal charge (3) Photoelectric conversion element defined in feature 2 in which the second semiconductor layer is connected to the node adapted to store a signal charge (4) Photoelectric conversion element defined in feature 1 in which the first semiconductor layer is made of polycrystalline silicon (5) Photoelectric conversion element defined in any one of features 1 to 4 in which the first semiconductor layer is provided in a selective region above the substrate and in which the light-shielding layer is provided in a region opposed to the first semiconductor layer (6) Photoelectric conversion element defined in any one of features 1 to 5 in which an insulating film is provided between the first semiconductor layer and light-shielding layer (7) Photoelectric conversion element defined in any one of features 1 to 6 including a transistor on the substrate in which the insulating film serves also as a gate insulating film of the transistor (8) Photoelectric conversion element defined in any one of features 1 to 7 including the transistor on the substrate in which the light-shielding layer is provided in the same layer as the gate electrode of the transistor (9) Photoelectric conversion element defined in feature 7 or 8 in which the light-shielding layer is made of the same material as the gate electrode

(10) Photoelectric conversion element defined in any one of features 1 to 9 including the transistor on the substrate in which the light-shielding layer is provided in a different layer from the gate electrode of the transistor

(11) Photoelectric conversion element defined in feature 10 in which the insulating film is provided in a lower layer than the gate electrode of the transistor and in which the light-shielding layer is provided between the insulating film and substrate over the entire surface of the substrate
(12) Photoelectric conversion element defined in any one of features 1 to 10 in which the light-shielding layer is maintained at the same potential as the first semiconductor layer
(13) Photoelectric conversion element defined in any one of features 1 to 12 in which the light-shielding layer is made of a high melting-point material
(14) Photoelectric conversion element defined in any one of features 1 to 13 in which the first semiconductor layer is provided in a selective region above the substrate, in which an interlayer insulating film having a contact hole opposed to the first semiconductor layer is provided above the substrate and on the first semiconductor layer, and in which the area of the light-shielding layer at its base is equal to or larger than the area of the opening of the contact hole on the side of the first semiconductor layer
(15) Photoelectric conversion element defined in any one of features 1 to 14 in which the first semiconductor layer is made of microcrystalline silicon
(16) Photoelectric conversion element defined in any one of features 1 to 15 being a PIN photodiode It should be understood by those skilled in the art that various modifications, combinations, sub-combinations and alterations may occur depending on design requirements and other factors in so far as they are within the scope of the appended claims or the equivalents thereof.

What is claimed is:

1. A photoelectric conversion element comprising:
    a first semiconductor layer of a first conductivity type provided above a substrate;
    a second semiconductor layer of a second conductivity type provided in a higher layer than the first semiconductor layer;
    a third semiconductor layer of a third conductivity type provided between the first semiconductor layer and the second semiconductor layer, wherein the third semiconductor layer is lower in electrical conductivity than the first semiconductor layer and the second semiconductor layer;
    a first interlayer insulating film having a contact hole formed therein, wherein within an area corresponding to the contact hole a portion of the third semiconductor layer is in contact with a first portion of the first semiconductor layer, wherein a portion of the first interlayer insulating film adjacent the contact hole is in contact with at least a second portion of the first semiconductor layer and separates the third semiconductor layer from the first semiconductor layer; and
    a light-shielding layer provided between the substrate and first semiconductor layer, wherein an area of the light-shielding layer is greater than an area of an opening of the contact hole;
    wherein an insulating film is provided between the first semiconductor layer and the light-shielding layer, and wherein no portion of the first semiconductor layer is in contact with the light-shielding layer.

2. The photoelectric conversion element of claim 1, wherein the first semiconductor layer is connected to a node adapted to store a signal charge.

3. The photoelectric conversion element of claim 1, wherein the second semiconductor layer is connected to the node adapted to store a signal charge.

4. The photoelectric conversion element of claim 1, wherein the first semiconductor layer is made of polycrystalline silicon.

5. The photoelectric conversion element of claim 1, wherein the first semiconductor layer is provided in a selective region above the substrate, and the light-shielding layer is provided in a region opposed to the first semiconductor layer.

6. The photoelectric conversion element of claim 1, further comprising: a transistor on the substrate, wherein the insulating film serves also as a gate insulating film of the transistor.

7. The photoelectric conversion element of claim 1, further comprising:
    a transistor on a substrate, wherein the light-shielding layer is provided in a same layer as a gate electrode of the transistor.

8. The photoelectric conversion element of claim 7, wherein the light-shielding layer is made of the same material as the gate electrode.

9. The photoelectric conversion element of claim 1, further comprising: a transistor on the substrate, wherein the light-shielding layer is provided in a different layer from a gate electrode of the transistor.

10. The photoelectric conversion element of claim 9, wherein The insulating film is provided in a lower layer than the gate electrode of the transistor, and the light-shielding layer is provided between the insulating film and substrate over the entire surface of the substrate.

11. The photoelectric conversion element of claim 1, wherein the light-shielding layer is maintained at the same potential as the first semiconductor layer.

12. The photoelectric conversion element of claim 1, wherein the light-shielding layer is made of a high melting-point material.

13. The photoelectric conversion element of claim 1, wherein the first semiconductor layer is provided in a selective region above the substrate, and wherein the light-shielding layer has tapered side surfaces.

14. The photoelectric conversion element of claim 1, wherein the first semiconductor layer is made of microcrystalline silicon.

15. The photoelectric conversion element of claim 1 being a PIN photodiode.

16. A photoelectric converter comprising: a plurality of pixels, each of the pixels including:
    a photoelectric conversion element, the photoelectric conversion element including:
        a first semiconductor layer of a first conductivity type provided above a substrate;
        a second semiconductor layer of a second conductivity type provided in a higher layer than the first semiconductor layer;
        a third semiconductor layer of a third conductivity type provided between the first semiconductor layer and the second semiconductor layer and lower in electrical conductivity than the first semiconductor layer and the second semiconductor layer;
        a first interlayer insulating film having a contact hole formed therein, wherein within an area corresponding to contact hole a portion of the third semiconductor layer is in contact with a first portion of the first semiconductor layer, wherein a portion of the first interlayer insulating film adjacent the contact hole is in contact with at least a second portion of the first semiconductor layer and separates the third semiconductor layer from the first semiconductor layer; and
        a light-shielding layer provided between the substrate and the first semiconductor layer, wherein an area of the light-shielding layer is greater than an area of an opening of the contact hole;
wherein an insulating film is provided between the first semiconductor layer and the light-shielding layer, and wherein no portion of the first semiconductor layer is in contact with the light-shielding layer.

17. The photoelectric converter of claim 16 being a radiographic imager.

18. The photoelectric converter of claim 16 being an optical touch sensor.

\* \* \* \* \*